(12) United States Patent
Do et al.

(10) Patent No.: US 9,624,379 B2
(45) Date of Patent: Apr. 18, 2017

(54) HIGH-EFFICIENCY HEAT-DISSIPATING PAINT COMPOSITION USING A CARBON MATERIAL

(75) Inventors: Seung Hoe Do, Daejeon (KR); Seong Cheol Hong, Daejeon (KR); Jin Seo Lee, Daejeon (KR); Joo Hee Han, Daejeon (KR)

(73) Assignee: Hanwha Chemical Corporation, Seoul (KR)

( * ) Notice: Subject to any disclaimer, the term of this patent is extended or adjusted under 35 U.S.C. 154(b) by 1053 days.

(21) Appl. No.: 13/814,057

(22) PCT Filed: Aug. 5, 2011

(86) PCT No.: PCT/KR2011/005750
§ 371 (c)(1),
(2), (4) Date: Apr. 12, 2013

(87) PCT Pub. No.: WO2012/018242
PCT Pub. Date: Feb. 9, 2012

(65) Prior Publication Data
US 2013/0200300 A1    Aug. 8, 2013

(30) Foreign Application Priority Data
Aug. 5, 2010 (KR) ......................... 10-2010-0075687

(51) Int. Cl.
*C09K 13/00* (2006.01)
*C09D 5/00* (2006.01)
(Continued)

(52) U.S. Cl.
CPC .............. *C09D 5/00* (2013.01); *C09D 7/125* (2013.01); *C09D 7/1225* (2013.01); *C09D 7/1291* (2013.01); *C09D 133/04* (2013.01); *C09K 5/00* (2013.01); *H01L 23/373* (2013.01); *H01L 23/3737* (2013.01); *H05K 7/20427* (2013.01); *C08K 3/04* (2013.01); *C08K 5/544* (2013.01);
(Continued)

(58) Field of Classification Search
CPC ...... C09D 7/00; C09D 7/1258; C09D 7/1291; C09K 5/00; C09K 5/08; C08K 3/04; C08K 13/02
USPC ............................................. 252/75
See application file for complete search history.

(56) References Cited

U.S. PATENT DOCUMENTS 3,347,632 A * 10/1967 Parker ................... C09C 1/565
106/472
4,735,981 A * 4/1988 Rich ...................... C08G 18/10
524/247
(Continued)

FOREIGN PATENT DOCUMENTS

CN          1331704 A    1/2002
CN        101755004 A    6/2010
(Continued)

*Primary Examiner* — Jane L Stanley
(74) *Attorney, Agent, or Firm* — The Webb Law Firm

(57) ABSTRACT

Provided is a heat-dissipating paint composition using a carbon material, the heat-dissipating paint composition including a dispersion solution containing a surface treated carbon material, a heat resistance additive, and an adhesion improving emulsion, so that the heat-dissipating paint composition can have excellent heat dissipation performance and can be applied to various industrial field requiring temperature control.

24 Claims, 1 Drawing Sheet

(51) Int. Cl.

| | | |
|---|---|---|
| *C09K 5/00* | (2006.01) | |
| *C09D 7/12* | (2006.01) | |
| *C09D 133/04* | (2006.01) | |
| *H01L 23/373* | (2006.01) | |
| *H05K 7/20* | (2006.01) | |
| *C08K 3/04* | (2006.01) | |
| *C08K 5/544* | (2006.01) | |
| *C08K 7/24* | (2006.01) | |
| *C08K 9/02* | (2006.01) | |

(52) U.S. Cl.
CPC ............... *C08K 7/24* (2013.01); *C08K 9/02* (2013.01); *H01L 2924/0002* (2013.01)

(56) References Cited

U.S. PATENT DOCUMENTS

| | | | | |
|---|---|---|---|---|
| 5,028,489 | A | * | 7/1991 | Kissel ............... C08J 3/215 |
| | | | | 106/14.05 |
| 5,158,605 | A | * | 10/1992 | Kissel ............... C08J 3/215 |
| | | | | 106/14.11 |
| 7,998,450 | B2 | | 8/2011 | Han et al. |
| 8,092,775 | B2 | | 1/2012 | Han et al. |
| 8,187,566 | B2 | | 5/2012 | Lee et al. |
| 2005/0139126 | A1 | * | 6/2005 | Khan ............... C04B 26/02 |
| | | | | 106/437 |
| 2007/0197705 | A1 | * | 8/2007 | Blank ............... C10M 173/02 |
| | | | | 524/420 |
| 2007/0248258 | A1 | | 10/2007 | Mitsui |
| 2009/0035707 | A1 | * | 2/2009 | Wang ............... C09D 5/24 |
| | | | | 430/322 |
| 2009/0130322 | A1 | * | 5/2009 | Nagano ............... C08G 18/6204 |
| | | | | 427/407.1 |
| 2009/0200517 | A1 | * | 8/2009 | El Bounia ............... B82Y 30/00 |
| | | | | 252/500 |
| 2009/0269267 | A1 | | 10/2009 | Lee et al. |
| 2013/0112109 | A1 | * | 5/2013 | Chen ............... C09D 7/1216 |
| | | | | 106/287.18 |

FOREIGN PATENT DOCUMENTS

| | | |
|---|---|---|
| JP | 2005104157 A | 4/2005 |
| JP | 2005272599 A | 10/2005 |
| JP | 2006114877 A | 4/2006 |
| JP | 2007294521 A | 11/2007 |
| JP | 2008280450 A | 11/2008 |
| JP | 2008303263 A | 12/2008 |
| KR | 19860001649 B1 | 10/1986 |
| KR | 20000040715 A | 7/2000 |
| KR | 20010084640 A | 9/2001 |
| KR | 20010088773 A | 9/2001 |
| KR | 100764340 B1 | 10/2007 |
| KR | 100827377 B1 | 5/2008 |
| KR | 1020090020843 A | 2/2009 |
| KR | 1020090103614 A | 10/2009 |
| KR | 1020090112021 A | 10/2009 |
| KR | 1020090124051 A | 12/2009 |
| KR | 1020100032811 A | 3/2010 |
| KR | 1020100036572 A | 4/2010 |
| KR | 100972753 B1 | 7/2010 |

* cited by examiner

HIGH-EFFICIENCY HEAT-DISSIPATING PAINT COMPOSITION USING A CARBON MATERIAL

TECHNICAL FIELD

The present invention relates to a heat-dissipating paint composition using a carbon material. More specifically, the present invention relates to a heat-dissipating paint composition having excellent heat resistance and dispersibility by including a surface treated carbon nanotube, a polymer solution for dispersing the carbon nanotube in a liquid phase, and a heat-resistant additive. Further, the present invention may further include an adhesion improving emulsion for further enhancing adhesive property with a substrate surface.

BACKGROUND ART

As electronic products are recently higher-integrated and smaller-sized, heat dissipation has emerged as a very big challenge. Generally, as a method for heat dissipation, a heat-dissipating plate having a maximized surface area is manufactured through extrusion-molding of aluminum or copper. If this is insufficient, a heat-dissipating structure is subjected to blackening treatment (anodizing) to improve heat dissipation efficiency or an air blower is installed to induce air convection, thereby solving cooling problems of electronic devices. However, the air blower has many problems such as noise, product lifespan, cost, impossible to reduce size, and the like, and thus has a limit in being applied to products.

Currently, with respect to display-related products such as LCD, PDP, and the like, mainly, an aluminum surface is subjected to blackening treatment to increase heat dissipation efficiency of the heat-dissipating plate and thereby to improve cooling efficiency by about 10%. However, in order to upgrade product performance and be applied to next products, current surface blackening treatment does not obtain desirable performances.

Theses problems make it difficult to miniaturize products, improve product performance, and verify designs, whereby products having excellent heat dissipation efficiency have been continuously developed and searched.

Carbon nanotube has been known to exhibit very superior characteristics in a heat-dissipating coating agent for maximizing heat dissipation efficiency. It has been known that carbon nanotube has a distinctive inner structure and excellent heat conductivity and thus heat conduction and heat dissipation effects thereof are very excellent.

However, carbon nanotube needs to be surface treated since dispersibility thereof necessary for being used as a coating agent and adhesive property thereof with a polymer are very low. When the carbon nanotube has low dispersibility and low compatibility, adhesive power and sticking power with a substrate are low, which causes easy film delamination, and thus heat conductivity from the substrate is degraded, resulting in deteriorating dissipation effects.

In order to solve these problems, the carbon nanotube is surface treated to induce functional groups thereon, so that compatibility of the carbon nanotube with a polymer can be improved and physical properties of the carbon nanotube can be enhanced.

Meanwhile, a surface treatment method of the carbon nanotube uses strong acid or strong base to disperse the carbon nanotube in water or an organic solvent. However, a large amount of wastewater generated during this procedure causes environmental burden and the carbon nanotube is damaged during the surface treatment procedure, causing failure in electrical conductivity.

DISCLOSURE

Technical Problem

An object of the present invention is to provide a heat-dissipating paint composition using a carbon material and, as a heat-resistant additive, metal oxide, the heat-dissipating paint composition having high heat dissipation effect due to high heat conductivity and heat dissipation rate and excellent heat resistance due to the metal oxide at the time of being applied to a heat-dissipating plate.

Further, another object of the present invention is to provide a heat-dissipating paint composition having improved dispersibility by using an adhesion improving emulsion including styrene and acryl based water soluble resin to disperse the carbon material in water or organic solvent.

Specifically, the present invention provides a first heat-dissipating paint composition including a dispersion solution containing a surface treated carbon material and a heat-resistant additive, the dispersion solution containing a surface treated carbon material including a surface-treated (functionalized) carbon material and an acryl based resin copolymer polymer solution for dispersing the carbon material in a liquid phase. In addition, the present invention provides a second heat-dissipating paint composition having further improved adhesive power with a substrate by further including an adhesion improving emulsion in addition to the first heat-dissipating paint composition. In addition, the present invention provides an insulation type heat-dissipating paint composition including an insulation additive in addition to the first heat-dissipating paint composition or the second heat-dissipating paint composition.

Still another object of the present invention is to provide a heat-dissipating composition capable of increasing heat dissipation efficiency and smoothening heat emission to thereby increase the product lifespan and achieve weight reduction and miniaturization of products, by being coated.

Specifically, the present invention provides a heat-dissipating paint composition capable of being applied to various fields, such as, LED lamps, electronic chips, heat exchangers, semiconductor equipment, condensers, evaporators, heaters, display devices, monitors, boiler piping, communications, engine, motors, batteries, housing materials, electrode materials, and textile manufacturing, and having excellent heat dissipation efficiency.

Technical Solution

The present invention is directed to providing a heat-dissipating paint composition, capable of having improved heat-dissipating property and dispersibility by using a surface treated carbon material. The present invention is characterized by using a styrene and acryl based water soluble resin to improve dispersibility of the surface treated carbon material, and characterized by containing, as a heat-resistant additive, metal oxide, to increase heat resistance after coating and maintaining a film structure against a heat source.

In addition, the present invention may further include an adhesion improving emulsion to further improve adhesion with a substrate as necessary, and particularly an aluminum heat-dissipating plate.

In addition, the present invention may further include, as necessary, any one or a mixture of two or more selected from organometal sol, polyester-polyurethane copolymer, polyurethane-epoxy copolymer, polyester-polyurethane-silicone copolymer, and polyester-epoxy copolymer, as an additive for imparting insulating property.

That is, the heat-dissipating paint composition of the present invention may be prepared in various types, and specific examples thereof may have four aspects.

As a first aspect of the present invention, there can be prepared a first heat-dissipating paint composition including: 80~99% of a dispersion solution containing a surface treated carbon material; and 1~20 wt % of a heat resistant additive.

As a second aspect of the present invention, there can be prepared a second heat-dissipating paint composition including: 80~95% of a dispersion solution containing a surface treated carbon material; 1~15 wt % of a heat resistant additive; and 1~10 wt % of an adhesion improving emulsion.

As a third aspect of the present invention, there can be provided a third heat-dissipating paint composition including, as an insulation additive, any one or a mixture of two or more selected from organometal sol, polyester-polyurethane copolymer, polyurethane-epoxy copolymer, polyester-polyurethane-silicone copolymer, and polyester-epoxy copolymer, in a content of 50~150 parts by weight based on 100 parts by weight of the first heat-dissipating paint composition including 80~99 wt % of a dispersion solution containing a surface treated carbon material and 1~20 wt % of a heat resistant additive.

As a fourth aspect of the present invention, there can be provided a fourth heat-dissipating paint composition including, as an insulation additive, any one or a mixture of two or more selected from organometal sol, polyester-polyurethane copolymer, polyurethane-epoxy copolymer, polyester-polyurethane-silicone copolymer, and polyester-epoxy copolymer, in a content of 50~150 parts by weight based on 100 parts by weight of the second heat-dissipating paint composition including 80~95% of a dispersion solution containing a surface treated carbon material, 1~15 wt % of a heat resistant additive, and 1~10 wt % of an adhesion improving emulsion.

Hereinafter, respective components of the heat-dissipating paint composition of the present invention will be described in more detail.

The dispersion solution containing a surface treated carbon material is a water based or solvent based dispersion having improved dispersibility by using a surface treated carbon material and an acryl based resin copolymer polymer. The first heat-dissipating paint composition is a water based or solvent based dispersion including the dispersion solution containing a surface treated carbon material and, as a heat resistant additive, metal oxide. The second heat-dissipating paint composition is a water based or solvent based dispersion further including an adhesion improving emulsion to improve adhesive property with an aluminum heat-dissipating plate as a substrate, in addition to the first heat-dissipating paint composition. In addition, the third heat-dissipating paint composition is a water based or solvent based dispersion further including an insulation additive for imparting insulating property, in addition to the first heat-dissipating paint composition. In addition, the fourth heat-dissipating paint composition is a water based or solvent based dispersion further including an insulation additive for imparting insulating property, in addition to the second heat-dissipating paint composition.

The present invention is characterized by a mixing ratio. The present invention may provide a heat-dissipating paint composition having excellent heat resistance and adhesive property within the above ranges and may be applied to various fields requiring heat management.

First, respective components constituting the first heat-dissipating paint composition of the present invention will be described in detail.

The first heat-dissipating paint composition of the present invention includes: 80~99% of a dispersion solution containing a surface treated carbon material; and 1~20 wt % of a heat resistant additive. If the content of the heat resistant additive is below 1 wt %, heat resistance may not be sufficiently increased and thus the heat dissipation improvement effect is insignificant. If the content of the heat resistant additive is above 20 wt %, heat conductivity and the heat dissipation effect of a carbon material may be deteriorated.

The dispersion solution containing a surface treated carbon material contains 0.1~10 wt % of a surface treated carbon material, 0.04~50 wt % of a styrene and acryl based water soluble resin, 0.005~15 wt % of ammonia water, an amine based compound, an inorganic alkali solution, or a mixture thereof; and 25~99.855 wt % of a solvent.

In the present invention, the carbon material is used to improve heat-dissipating property, and any one or a mixture of two or more selected from single-walled carbon nanotube, double walled carbon nanotube, thin multi-walled carbon nanotube, multi-walled carbon nanotube, roped carbon nanotube, graphite, graphite oxide, graphene, graphene oxide, carbon black, carbon fiber, and carbon nanofiber may be used. It is more preferable to use carbon nanotube in them. Carbon nanotube having a length of several to several hundreds of micrometers and a diameter of several to several tens of nanometers may be used, but in consideration of economical, thermal, and mechanical characteristics and purifying, filtering, surface functionalizing, and dispersing procedures, a surface treated carbon nanotube may preferably have a diameter of 0.5 to 100 nm and a length of 0.1 to 500 μm. The content thereof is preferably 0.1 to 10 wt % in the first heat-dissipating paint composition. If the content of the surface treated carbon material is below 0.1 wt %, the surface area and heat dissipation rate are low and thus the heat dissipation effect may be slight. If above 10 wt %, the heat dissipation effect is slightly increased, resulting in increasing the manufacturing cost.

The surface treated carbon material of the present invention includes one that is surface treated with a hydrophilic functional group. The hydrophilic functional group may be selected from the group consisting of oxygen, nitrogen, sulfur, and mixtures thereof.

In addition, the surface treated carbon nanotube of the present invention includes carbon nanotube of which a surface is oxidized by applying acid and an oxidant, or carbon nanotube of which a surface is oxidized by reactivity of water under high temperature and high pressure. The functionalizing of the carbon nanotube may be performed by using technologies described in Korean Patent Application Nos. 10-2008-0029333, 10-2008-0037685, 10-2008-0050048, and 10-2008-095856, by the present applicant.

Specifically, the surface treated carbon nanotube is obtained by oxidizing a surface of the carbon nanotube, using at least one oxidant selected from oxygen, air, ozone, aqueous hydrogen peroxide, and a nitro compound, under subcritical water or supercritical water conditions, or obtained by oxidizing a surface of the carbon nanotube, using carboxylic acid, nitric acid, phosphoric acid, sulfuric acid, hydrofluoric acid, hydrochloric acid, aqueous hydrogen peroxide, or a mixture thereof.

More specifically, the surface treated carbon nanotube obtained by using the subcritical water or supercritical water conditions is obtained by oxidizing a surface of the carbon nanotube, using an oxidant selected from oxygen, air, ozone, aqueous hydrogen peroxide, a nitro compound, and a mixture thereof, under conditions of a pressure of 50 to 400 atm and a temperature of 100 to 600° C.

Therefore, there can be obtained an environmentally friendly surface treated carbon nanotube by using an oxidant that is harmless under the subcritical water or supercritical water conditions and facilitates handling and waste water disposal. Surface treatment under the subcritical water or supercritical water conditions allows the oxidant to be uniformly introduced to the entire carbon nanotube at a high diffusion rate and high permeability, so that surface treatment effect of the carbon nanotube can be increased whereby dispersibility thereof can be increased. In addition, the carbon nanotube may be continuously mass-modified, so that the surface treated carbon nanotube can be mass-produced for a short time at a low cost.

The surface modifying of the carbon nanotube using the subcritical water or supercritical water conditions may be performed by using technologies described in Korean Patent Application Nos. 10-2008-0029333, 10-2008-0037685, 10-2008-0050048, and 10-2008-095856.

As another method, the surface treated carbon nanotube may be obtained by an oxidizing reaction of the surface of the carbon nanotube while carboxylic acid, nitric acid, phosphoric acid, sulfuric acid, hydrofluoric acid, hydrochloric acid, aqueous hydrogen peroxide, or a mixture thereof is added to the carbon nanotube. The oxidation for surface treatment may be simply provided due to introduction of the oxidant.

As the surface treated carbon nanotube according to the present invention, one that is surface treated (surface-oxidized) so as to contain 0.1 to 10 parts by weight of oxygen, nitrogen, sulfur, or a mixture thereof based on 100 parts by weight of the carbon nanotube may be preferably used.

The carbon nanotube surface treated by oxidation may be very homogeneously and effectively mixed with a solvent such as water, an organic solvent, or the like, and a styrene and acryl based water soluble resin, and particularly, have remarkably high dispersibility with the styrene and acryl based water soluble resin, thereby forming a uniform heat-dissipating coating film.

The styrene and acryl based water soluble resin used in the dispersion solution containing a surface treated carbon material is an alkali soluble resin, and is used to improve dispersibility of the surface treated carbon nanotube. A resin obtained by copolymerization of styrene and alphamethylstyrene, and acrylic acid, (C1~C20) alkylmethacrylate, and (C1~C20) alkylacrylate may be used. Specifically, a resin obtained by copolymerization of 30~40 wt % of styrene, 30~35 wt % of alphamethylstyrene, and 30~35 wt % of acrylic acid may be preferably used. The styrene and acryl based water soluble resin is a resin that is soluble in a basic solution.

As the styrene and acryl based water soluble resin, one that is obtained by continuous bulk polymerization of styrene alone or a styrene based monomer selected from a mixture of styrene and alphamethylstyrene and an acryl based monomer at a reaction temperature of 100~200° C. in the presence of a mixed solvent of diethylene glycol monomethyl ether or dipropylene glycol methyl ether and water, may be preferably used. Here, the styrene based monomer and the acryl based monomer may be mixed at a weight ratio of 60~80:20~40. The styrene based monomer may include styrene alone or styrene and alphamethylstyrene monomers mixed at a mixture weight ratio of 50~90: 10~50, and the acryl based monomer may include acrylic acid alone or acrylic acid and alkylacrylate monomer at a weight ratio of 80~90:10~20.

More preferably, the styrene and acryl based water soluble resin is obtained by reacting 10~30 wt % of styrene, 20~40 wt % of alphamethylstyrene, and 30~40 wt % of acrylic acid, and 0.1~10 wt % of (C1~C20) alkylmethacrylate, (C1~C20) alkylacrylate, or a mixture thereof in the presence of a mixed solvent of dipropylene glycol methyl ether and water. It is preferable to use a styrene and acryl based water soluble resin having a weight average molecular weight of 1,000~100,000 in view of excellent dispersibility and excellent blendability with carbon nanotube.

Also, the styrene and acryl based water soluble resin may be prepared by methods described in Korean Patent Application Nos. 10-2001-0088773, 10-2001-0084640, and 10-2000-040715 by the present applicant.

The styrene and acryl based water soluble resin may be preferably included in a content of 04~50 wt % in the dispersion solution containing a surface treated carbon material. If the content of the styrene and acryl based water soluble resin is below 0.04 wt %, the dispersion solution effect may be slight. If above 50 wt %, dispersibility and heat dissipation property of the carbon material may be deteriorated.

As the solvent used in the dispersion solution containing a surface treated carbon material of the present invention, water or an organic solvent may be used. In the case where water is used, it is preferable to use 0.005~15 wt % of ammonia water, an amine based compound, an inorganic alkali solution, or a mixture thereof so as to facilitate dissolution of the styrene and acryl based water soluble resin. As the amine based compound used herein, for example, an amine compound such as, monoethanol amine, diethanol amine, triethanol amine, propanol amine, dipropanol amine, tree-propanol amine, or the like, may be used. As the inorganic alkali solution, KOH, NaOH, LiOH, $K_2CO_3$, $Na_2CO_3$, $LiCO_3$ or the like may be used. When these are added, the pH value is preferably controlled to reach 7~10.

The heat resistant additive in the first heat-dissipating paint composition of the present invention may include 0.1~20 wt % of heat-resistance metal oxide and 80~99.9 wt % of an alkali soluble resin emulsion.

The heat-resistant metal oxide is used to improve heat resistance, and includes metal oxide, metal hydroxide, or metal ammonium compounds. More specifically, as the metal oxide, one alone or a mixture of two or more selected from the group consisting of aluminum oxide, magnesium oxide, beryllium oxide, zirconium oxide, calcium oxide, titanium oxide, zinc oxide, silicon oxide, iron oxide, boron nitride, aluminum nitride, silicon nitride, titanium nitride, zirconium nitride, hafnium nitride, and nitride of niobium, but is not limited thereto. The metal oxide is used in the present invention, and, thus when the heat-dissipating paint composition is coated on a substrate surface, the metal oxide leads to an increase in heat conductivity and improvement in heat resistance, so that the heat-dissipating property can be further improved. The content of the metal oxide is preferably used in a content of 0.1~20 wt % in the heat resistant additive in view of excellent dispersibility in the alkali soluble resin emulsion. If the content of the metal oxide is below 0.1 wt %, heat resistance and heat-dissipating property may be slight. If above 20 wt %, heat resistance and heat-dissipating property are slightly increased, causing an increase in production cost. The metal oxide is dissolved in an acidic solution or a basic solution, to be in a state of metal hydroxide or metal ammonium compound.

The alkali soluble resin emulsion improves dispersibility of metal oxide, metal hydroxide, or a metal ammonium compound, and improves blendability with the dispersion solution containing a surface treated carbon material, to thereby improve long-term storage stability. An alkali soluble resin emulsion including a styrene and acryl based water soluble resin and prepared in an emulsion sate is used. Here, the content of solid included in the emulsion may be preferably 40~50 wt %.

The alkali soluble resin emulsion used in the heat resistant additive may include water; ammonia water, an amine based compound, an inorganic alkali solution, or a mixture thereof; a styrene and acryl based water soluble resin, and has a solid content of 40~50 wt %.

Specifically, the alkali soluble resin emulsion used in the heat resistant additive may include 5~25 wt % of a styrene and acryl based water soluble resin, 40~70 wt % of water; and 0.1~5 wt % of ammonia water, an amine based compound, an inorganic alkali solution, or a mixture thereof.

The styrene and acryl based water soluble resin in the alkali soluble resin used in the heat resistant additive may be obtained by a reaction of 5~25 wt % of a styrene and acryl based water soluble resin, which is obtained by a reaction of 30~40 wt % of styrene, 30~35 wt % of alphamethyl styrene, and 30~35 wt % of acrylic acid in the presence of a mixed solvent of dipropylene glycol methyl ether and water; 0.1~5 wt % of styrene; 65~80 wt % of 2-ethylhexyl acrylate; 0.1~3 wt % of glycidyl methacrylate; and 0.1~2 wt % of an initiator.

The styrene and acryl based water soluble resin preferably uses a resin that is the same as the alkali soluble resin used in the dispersion solution containing a surface treated carbon material in view of excellent dispersibility, but a different resin may be used. The styrene and acryl based water soluble resin may be preferably used in a content of 5~25 wt % in the alkali soluble resin emulsion, If the styrene and acryl based water soluble resin is used in a content of below 5 wt % or above 25 wt %, polymerization may not be completely performed.

Next, respective components constituting the second heat-dissipating paint composition of the present invention will be described in more detail.

The second heat-dissipating paint composition is used by mixing 80~95 wt % of a dispersion solution containing a surface treated carbon material; 1~15 wt % of a heat resistant additive; and 1~10 wt % of an adhesion improving emulsion. If the adhesion improving emulsion is included in a content of below 1 wt %, adhesive power may be slightly improved. If above 10 wt %, the heat dissipation effect may be rather deteriorated.

The adhesion improving emulsion is used to further enhance adhesive power with a substrate and enhance sticking power with a surface of the substrate, thereby decreasing an interface resistance and thus further improve heat conductivity. As the adhesion improving emulsion, an acryl based resin emulsion including water; ammonia water, an amine based compound, an inorganic alkali solution, or a mixture thereof; an acryl based resin and having a solid content of 40~50 wt % and a particle size of 30~300 nm may be preferably used.

As the acryl based resin emulsion, a resin having excellent compatibility with the styrene and acryl based water soluble resin used in the first heat-dissipating paint composition, an acryl based resin, may be selectively used.

The acryl based resin may be prepared by using alkyl (meth)acryl based monomer, itaconic acid, a silane coupling agent or an acryl based cross-linking monomer, an initiator, and an additives, and more preferably, may have a weight average molecular weight of 1,000~100,000.

As the alkyl(meth)acyl based monomer, methyl acrylate, methyl methacrylate, ethyl acrylate, ethyl methacrylate, propyl acrylate, propyl methacrylate, butyl acrylate, butyl methacrylate, or the like may be used, but is not limited thereto. In addition, any one or a mixture of two or more selected from these may be used.

The itaconic acid is used alone or in a mixture with alkyl(meth)acryl based monomer, and may be preferably used in a range of 0.1~1 wt % based on the content of the acryl based resin.

The silane coupling agent or acryl based cross-linking monomer may be preferably used in a range of 0.01~10 wt % based on the content of the acryl based resin in view of excellent adhesive property. Any one or a mixture of two or more selected from aminopropyltrimethoxsilane, aminopropyltriethoxysilane, γ-glycidoxypropyltrimethoxysilane, γ-glycidoxypropyltriethoxysilane, γ-glycidoxypropylmethyldimethoxysilane, γ-glycidoxypropylmethyldiethoxysilane, epoxycyclohexylethyltrimethoxysilane, vinyltrimethoxysilane, vinyltriethoxysilane, vinyltriacetooxysilane, methylvinyldimethoxysilane, and 3-isocyanatepropyltriethoxysilane may be used as the silane coupling agent in view of excellent adhesive property, but is not limited thereto.

As the initiator, any peroxide based initiator may be used without limitation, and as the additive, an emulsifier, a dispersant, or the like may be used.

Next, the third heat-dissipating paint composition and the fourth heat-dissipating paint composition of the present invention will be described in detail.

The third heat-dissipating paint composition of the present invention includes 50~150 parts by weight of the insulation additive based on 100 parts by weight of the first heat-dissipating paint composition.

The fourth heat-dissipating paint composition of the present invention includes 50~150 parts by weight of the insulation additive based on 100 parts by weight of the second heat-dissipating paint composition.

In the third heat-dissipating paint composition and the fourth heat-dissipating paint composition each, the insulation additive may be preferably included in a content of 50~150 parts by weight since expression of insulating property is possible, heat dissipation performance is not affected, and economical manufacturing is possible. If the insulation additive is used in a content of below 50 parts by weight, the insulating property improvement effect is slight. If above 150 parts by weight, the heat dissipation effect may be deteriorated.

As the insulation additive, any one or a mixture of two or more selected from organometal sol, polyester-polyurethane copolymer, polyurethane-epoxy copolymer, polyester-polyurethane-silicone copolymer, and polyester-epoxy copolymer may be preferably used.

More specifically, as the organometal sol, any one or a mixture of two or more selected from silica sol, organosilane sol, zirconia sol, titania sol, and alumina sol may be used.

The heat-dissipating paint composition according to the present invention may be coated by one or more methods of dip coating, spray coating, casting, painting, E-painting, roll-to-roll coating, and printing, and is coated to a thickness of 0.001~1000 µm to thereby exhibit an excellent heat dissipation effect.

The heat-dissipating paint composition according to the present invention may be applied to various fields, such as, LED lamps, electronic chips, heat exchangers, semiconductor equipment, condensers, evaporators, heaters, display devices, monitors, boiler piping, communications, engine, motors, batteries, housing materials, electrode materials, and textile manufacturing, and is not limited thereto.

More specifically, the heat-dissipating paint composition according to the present invention may be applied to an LED lamp, high-temperature parts of an electronic chip (CPU or GPU), a micro-channel heat exchanger, cooling of semiconductor equipment (microprocessor, CPU, GPU), a condenser and an evaporator of a refrigerator, a condenser and an evaporator of heater air conditioner, a heat exchanger for heat industries, TV (LCD, PDP, LED) or computer monitor, radiator or boiler piping, communications, a field of national defense and automotive (engine), mechanical devices (motor), a light source, a compact high-power LED, heat-dissipating system for a semiconductor chip, network server (network server), game consoles, semiconductor chips, semiconductor packages, batteries, electronic products, antistatic materials, electrostatic dissipative materials, conductive materials, electromagnetic shielding materials, electromagnetic wave absorbers, radio frequency (RF) absorbers, solar cell materials, electrode materials for dye-sensitized solar cell (DSSC), electrical device materials, electronic device materials, semiconductor device materials, optoelectronic device materials, laptop part materials, computer part materials, mobile phone part materials, PDA part materials, PSP part materials, part materials for game console, housing materials, transparent electrode materials, opaque electrode materials, field emission display (FED) materials, back light unit (BLU) materials, liquid crystal display (LCD) materials, plasma display panel (PDP) materials, light-emitting diode (LED) materials, touch panel materials, electronic board materials, advertising panel materials, display materials, heating elements, heat-dissipating elements, plating materials, catalysts, co-catalysts, oxidant, reductant, vehicle part materials, lamp heat-dissipating system including vehicle head lamps, ship part materials, aerospace equipment part materials, protecting tape materials, adhesive materials, tray materials, clean room materials, transportation equipment part materials, flame-retardant materials, antibacterial materials, metal composite materials, non-iron metal materials, materials for medical devices, building materials, flooring materials, wallpaper materials, light source part materials, lamp materials, optical device part materials, materials for manufacturing textile, materials for making clothing, materials for electrical appliances, material for manufacturing electrical appliance, cathode active material for secondary battery, anode active material for secondary battery, secondary battery materials, fuel cell materials, solar cell materials, memory device and capacitor (P-ED<C) materials, and the like.

Advantageous Effects

As set forth, the heat-dissipating paint composition according to the present invention can have excellent heat resistance and superior adhesive property and sticking property with the substrate surface.

Specifically, while the temperature of the heating element surface rises to 128° C. when the aluminum heat-dissipating plate without using heat-dissipating paint of the related art is used, the temperature of the heating element surface can be lowered to 70° C. or lower when the first heat-dissipating paint composition according to the present invention is coated on the heating element. Further, when the second heat-dissipating paint composition including the adhesion improving emulsion in addition to the first heat-dissipating paint composition for improving adhesive property is coated on the heating element, the temperature of the heating element surface can be lowered to 60° C. or lower. Further, the third heat-dissipating paint composition and the fourth heat-dissipating paint composition can impart insulating property.

DETAILED DESCRIPTION OF MAIN ELEMENTS

Figure 1:
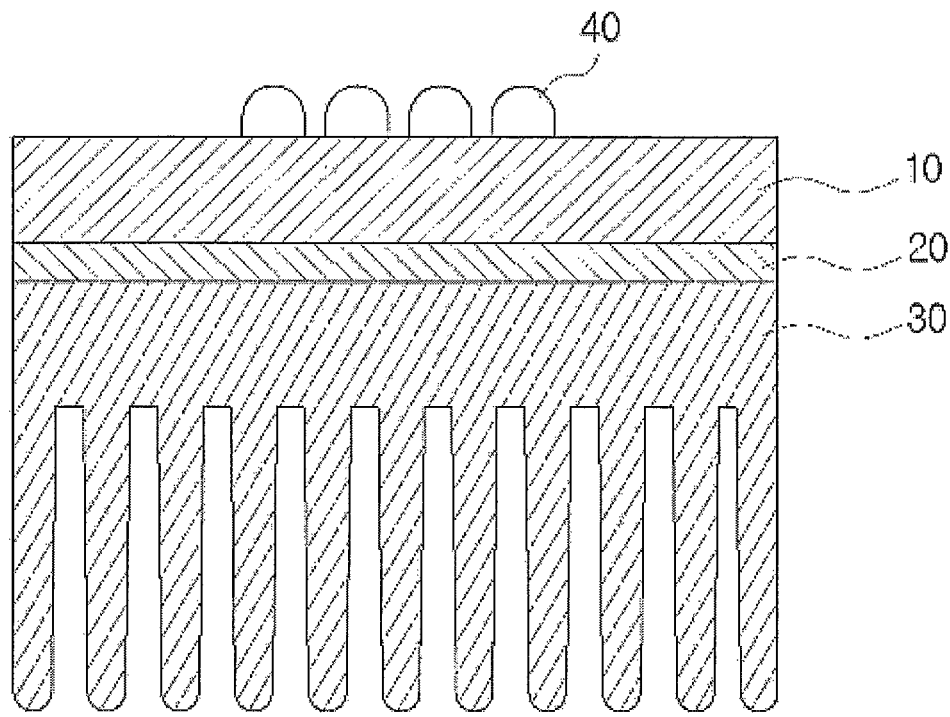
FIG. 1 is a schematic view of an apparatus used to measure a heat dissipation effect in Experimental Example 1 of the present invention.

10: metal PCB substrate
20: interlayer heat conduction adhesive layer
30: aluminum heat-dissipating plate coated with heat-dissipating paint
40: LED lamp
50: rubber roll
60: heating metal roll
70: heat-dissipating paint coating layer
80: aluminum substrate

BEST MODE

Hereinafter, the present invention will be in detail described by examples, but the present invention is not limited to the following examples.

Physical properties were evaluated by the following measurement methods.

1) Evaluation on Adhesive Property

Measurement was performed by a tape test (JIS D0202) method. Checkerboard-shaped eyes with 1 mm in width and length were cut in an aluminum heat-dissipating plate coated with a heat-dissipating paint, to which a cellophane tape was then allowed to adhere, and then while the cellophane tape was peeled, a detachment phenomenon was observed. M6 represent a case where all the square cells are peeled, and M5<M4<M3<M2<M1 represents stronger adhesive property. For example, M3 represents a degree at which peeling is acceptable along a straight line and 50% or higher of square pieces of square cells need not be peeled. M2 represents a degree at which corner breakage is entirely shown, peeling along a straight line does not occur, and 50% or higher of square pieces of square cells need not be peeled.

2) Evaluation on Heat Resistance

Figure 2:
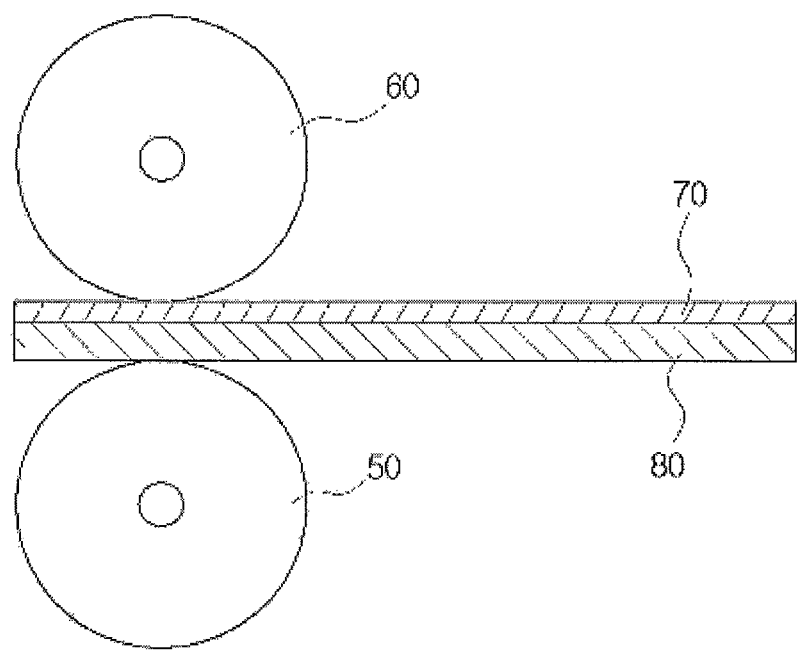
FIG. 2 shows a method of measuring heat resistance.

Measurement was performed by a heating roll test (see, FIG. 2). While both of a lower rubber roll and an upper metal heating roll were simultaneously rolled, the temperature of the upper metal heating roll is raised to 20~350° C. at an interval of 10° C. When a substrate passes between the two rolls while a coating surface coated with a heat-dissipating paint faces a surface of the heating roll, it was confirmed whether or not a coating part was transferred to the surface of the heating roll. Heat resistance was evaluated by the state of the coating surface and the transferring of the coating surface to the heating roll.

3) Evaluation on Insulating Property

Measurement was performed by a sheet resistance measurement method (JIS K7194, ASTM D257). A sample was divided into 9 parts by being cut to a size of 5×8 cm, and then the measurement was performed. An inherent sheet resistance of the sample was obtained by applying a voltage of 10~1000 volt, using the 4 point probe method having 4 probes and then excluding contact resistance as much as possible. It was evaluated that insulating property exhibited a sheet resistance of $10^5$ Ω/sq or higher.

Preparative Example 1

Preparation of Dispersion Solution Containing Surface Treated Carbon Material

An aqueous CNT solution was prepared in a pre-treating bath by mixing carbon nanotube (CNT) 15 g with distilled water 985 g using a circulation pump. Before the aqueous CNT solution is inputted to a preheating bath through a high-pressure injection pump at a flow rate of 30 g/min, a gas phase oxygen compressed to 252 atm was mixed with the aqueous CNT solution at a front end of a heat exchanger at a flow rate of 0.8 g/min. The mixture liquid was inputted to the preheating bath that has been preheated to 200° C. through the heat exchanger. The preheated mixture liquid was injected to a surface treatment reactor in a subcritical water state of 210° C. and 250 atm, and then surface treated. The surface treated product was again transferred to the heat exchanger, and firstly cooled to 100° C. and then again cooled to about 25° C. by a cooling apparatus, thereby obtaining a continuously surface treated CNT 14.3 g.

3 wt % of the surface treated carbon nanotube, 2.4 wt % of a styrene and acryl based water soluble resin (weight average molecular weight:100,000, including 35 wt % of styrene, 32.5 wt % of alphamethyl styrene, and 32.5 wt % of acrylic acid), 94.24 wt % of water, and 0.36 wt % of ammonia water were mixed to prepare a dispersion solution containing a surface treated carbon material.

Preparative Example 2

Preparation of Heat Resistant Additive

A heat resistant additive was prepared by using 90 wt % of the dispersion solution prepared in Preparative Example 1 and 10 wt % of an aqueous alkali resin emulsion containing zinc oxide as heat-resistant metal oxide.

Here, the aqueous alkali resin emulsion was used by mixing 52.1 wt % of water, 1.9 wt % of ammonia water, and 46 wt % of solid. As the solid, a resin obtained by reacting 20.7 wt % of a styrene and acryl based water soluble resin (weight average molecular weight:100,000, including 35 wt % of styrene, 32.5 wt % of alphamethyl styrene, and 32.5 wt % of acrylic acid), 4.2 wt % of styrene, 73.3 wt % of 2-ethylhexyl acrylate, 1.2 wt % of glycidyl methacrylate, and 0.6 wt % of ammonium peroxide as an initiator was used.

Preparative Example 3

Preparation of Adhesion Improving Emulsion

An adhesion improving emulsion was prepared by mixing 54.9 wt % of water, 0.2 wt % of 27% ammonia water, and 44.9 wt % of an acryl based resin (weight average molecular weight: 15,000) as a solid.

Here, as the acryl based resin used as a solid, a resin obtained by reacting 49.0 wt % of butyl acrylate, 49.4 wt % of methyl methacrylate, 0.6 wt % of itaconic acid, 0.6 wt % of a silane coupling agent (aminopropyltrimethoxysilane), and 0.4 wt % of ammonium peroxide as an initiator was used.

Preparative Example 4

Preparation of Insulation Additive

A zirconia sol was prepared by mixing tetrapropyl zirconate (100 ml) and ethylacetoacetate (100 ml) and then adding a nitric acid solution (17 ml) thereto.

An organosilane sol was prepared by mixing 3-glycidyloxypropyltrimethoxysilane (100 ml), isopropylalcohol (110 ml), and a nitric acid solution (16 ml).

The zirconia sol and the organosilane sol were mixed at a volume ratio of 1:2 to prepare a zirconia-organosilane sol-gel coating development liquid as an insulation additive.

Example 1

Preparation of First Heat-Dissipating Paint Composition (1)

80 wt % of the first heat-dissipating paint composition prepared in Preparative Example 1 and 20 wt % of the heat resistant additive prepared in Preparative Example 2 were mixed to prepare a first heat-dissipating paint composition (1).

In order to measure heat resistance and adhesive property the prepared heat-dissipating paint composition, the prepared heat-dissipating paint composition was coated on one surface of an aluminum heat-dissipating plate (Al 6061) to a thickness of 10 μm by dip coating, and then measurement was performed. The results were tabulated in Table 2 below.

Example 2

Preparation of First Heat-Dissipating Paint Composition (2)

90 wt % of the first heat-dissipating paint composition prepared in Preparative Example 1 and 10 wt % of the heat resistant additive prepared in Preparative Example 2 were mixed to prepare a first heat-dissipating paint composition (2).

In order to measure heat resistance and sticking property of the prepared heat-dissipating paint composition, the prepared heat-dissipating paint composition was coated on one surface of an aluminum heat-dissipating plate (Al 6061) to a thickness of 10 μm by dip coating, and then measurement was performed. The results were tabulated in Table 2 below.

Example 3

Preparation of First Heat-Dissipating Paint Composition (3)

99 wt % of the first heat-dissipating paint composition prepared in Preparative Example 1 and 1 wt % of the heat resistant additive prepared in Preparative Example 2 were mixed to prepare a first heat-dissipating paint composition (3).

In order to measure heat resistance and sticking property of the prepared heat-dissipating paint composition, the prepared heat-dissipating paint composition was coated on one surface of an aluminum heat-dissipating plate (AI 6061) to a thickness of 10 μm by dip coating, and then a measurement was performed. The results were tabulated in Table 2 below.

Example 4

Preparation of Second Heat-Dissipating Paint Composition (1)

80 wt % of the first heat-dissipating paint composition prepared in Preparative Example 1, 10 wt % of the heat resistant additive prepared in Preparative Example 2, and 10 wt % of the adhesion improving emulsion prepared in Preparative Example 3 were mixed to prepare a second heat-dissipating paint composition (1).

In order to measure heat resistance and sticking property of the prepared heat-dissipating paint composition, the prepared heat-dissipating paint composition was coated on one surface of an aluminum heat-dissipating plate (AI 6061) to a thickness of 10 μm by dip coating, and then measurement was performed. The results were tabulated in Table 2 below.

Example 5

Preparation of Second Heat-Dissipating Paint Composition (2)

85 wt % of the first heat-dissipating paint composition prepared in Preparative Example 1, 10 wt % of the heat resistant additive prepared in Preparative Example 2, and 5 wt % of the adhesion improving emulsion prepared in Preparative Example 3 were mixed to prepare a second heat-dissipating paint composition (2).

In order to measure heat resistance and sticking property of the prepared heat-dissipating paint composition, the prepared heat-dissipating paint composition was coated on one surface of an aluminum heat-dissipating plate (AI 6061) to a thickness of 10 μm by dip coating, and then measurement was performed. The results were tabulated in Table 2 below.

Example 6

Preparation of Second Heat-Dissipating Paint Composition (3)

84 wt % of the first heat-dissipating paint composition prepared in Preparative Example 1, 15 wt % of the heat resistant additive prepared in Preparative Example 2, and 1 wt % of the adhesion improving emulsion prepared in Preparative Example 3 were mixed to prepare a second heat-dissipating paint composition (3).

In order to measure heat resistance and sticking property of the prepared heat-dissipating paint composition, the prepared heat-dissipating paint composition was coated on one surface of an aluminum heat-dissipating plate (AI 6061) to a thickness of 10 μm by dip coating, and then measurement was performed. The results were tabulated in Table 2 below.

TABLE 1

(Unit: wt %)

| | Preparative Example 1 | Preparative Example 2 | Preparative Example 3 |
|---|---|---|---|
| Example 1 | 80 | 20 | — |
| Example 2 | 90 | 10 | — |
| Example 3 | 99 | 1 | — |
| Example 4 | 80 | 10 | 10 |
| Example 5 | 85 | 10 | 5 |
| Example 6 | 84 | 15 | 1 |

Examples 7 to 9

Preparation of Third Heat-Dissipating Paint Composition 80 parts by weight of the insulation additive prepared in Preparative Example 4 was added based on 100 parts by weight of the heat-dissipating paint composition prepared in each of Examples 1 to 3, to thereby prepare a third heat-dissipating paint composition.

In order to measure heat resistance and sticking property of the prepared heat-dissipating paint composition, the prepared heat-dissipating paint composition was coated on one surface of an aluminum heat-dissipating plate (AI 6061) to a thickness of 10 μm by dip coating, and then measurement was performed. The results were tabulated in Table 2 below.

Examples 10 to 12

Preparation of Forth Heat-Dissipating Paint Composition 80 parts by weight of the insulation additive prepared in Preparative Example 4 was added based on 100 parts by weight of the heat-dissipating paint composition prepared in each of Examples 4 to 6, to thereby prepare a fourth heat-dissipating paint composition.

In order to measure heat resistance and sticking property of the prepared heat-dissipating paint composition, the prepared heat-dissipating paint composition was coated on one surface of an aluminum heat-dissipating plate (AI 6061) to a thickness of 10 μm by dip coating, and then measurement was performed. The results were tabulated in Table 2 below.

Comparative Example 1

70 wt % of the heat resistant additive prepared in Preparative Example 2 and 30 wt % of an adhesion improving emulsion were mixed. Physical properties of the prepared heat-dissipating paint composition were measured, and the measured results were tabulated in Table 2.

Comparative Example 2

90 wt % of the dispersion solution prepared in Preparative Example 1 and 10 wt % of the adhesion improving emulsion prepared in Preparative Example 3 were mixed. Physical properties of the prepared heat-dissipating paint composition were measured, and the measured results were tabulated in Table 2.

Experimental Example 1

Heat Dissipation Test Application to LED Lamp

The physical properties of the heat-dissipating paint composition prepared in each of Examples 1 to 12 and Comparative Examples 1 to 3 were measured, and the results were tabulated in Table 2.

Heat-dissipating performance was measured by a surface temperature measurement method of a metal PCB based LED lamp. An apparatus shown in FIG. 1 were configured and electricity was applied to the LED lamp, and then temperatures of the surface thereof were measured at an interval of 5 seconds.

TABLE 2

| | Adhesive Property | Heat-Dissipating Property: Metal PCB Surface Temperature (° C.) | Heat Resistance | Insulating Property |
|---|---|---|---|---|
| Example 1 | M6 | 69° C. | >300° C. | <$10^5$ Ω/sq |
| Example 2 | M6 | 67° C. | >300° C. | <$10^5$ Ω/sq |
| Example 3 | M6 | 71° C. | >300° C. | <$10^5$ Ω/sq |
| Example 4 | <M2.5 | 59° C. | >300° C. | <$10^5$ Ω/sq |
| Example 5 | <M2.5 | 57° C. | >300° C. | <$10^5$ Ω/sq |
| Example 6 | M3.5 | 60° C. | >300° C. | <$10^5$ Ω/sq |
| Example 7 | <M2.5 | 108° C. | >300° C. | >$10^{11}$ Ω/sq |
| Example 8 | <M2.5 | 105° C. | >300° C. | >$10^9$ Ω/sq |
| Example 9 | <M2.5 | 118° C. | >300° C. | >$10^8$ Ω/sq |
| Example 10 | <M2.5 | 85° C. | >300° C. | >$10^{10}$ Ω/sq |
| Example 11 | <M2.5 | 84° C. | >300° C. | >$10^{10}$ Ω/sq |
| Example 12 | <M2.5 | 91° C. | >300° C. | >$10^{10}$ Ω/sq |
| Comparative Example 1 | <M2.5 | 125° C. | >300° C. | <$10^5$ Ω/sq |
| Comparative Example 2 | <M2.5 | 120° C. | 70° C. | <$10^5$ Ω/sq |
| Comparative Example 3 | | 128° C. | 100° C. | <$10^5$ Ω/sq |

It may be seen from Table 2 above, that the heat dissipation effect was remarkable due to a bigger superficial area in the case where the heat-dissipating paint of the present invention is use than in the case where the heat-dissipating paint is not coated.

It may be seen that, in the case where an aluminum heat-dissipating plate itself is used without being coated with the heat-dissipating paint (Comparative Example 3), the temperature of the surface of the heating element was continuously increased to 128° C., and in the case where the second heat-dissipating paint composition is used (Examples 1 to 3), the temperatures of the surface of the heating element are 67~71° C., which is very decreased to 71° C. or lower. In addition, it may be seen that, in the case where the adhesion improving emulsion is added thereto (the third heat-dissipating paint composition, Examples 4 to 6), the temperature was decreased to 57° C., thereby exhibiting an excellent heat dissipation effect.

In addition, it may be seen from Examples 7 to 12 that, in the case where the fourth heat dissipation paint composition as an insulation additive was used, the sheet resistances were very high, $10^8$ Ω/sq or higher, which exhibits insulating property, and the surface temperature was increased as compared with the samples of Examples 1 to 6.

Experimental Example 2

Heat Dissipation Test: Application to Heat Sink

A lid (plate type heat sink for heat dissipation, made of aluminum and an alloy thereof) of a CPU used in a semiconductor device and a display was coated with the heat-dissipating paint composition prepared in each of Examples 4 to 7, and the heat dissipation performance thereof was confirmed.

The heat-dissipating paint composition of each of Example 4 and Example 7 was coated on the heat-dissipating plate (lid) to a thickness of 10 μm by dip coating, and then measurement was performed. A TIM tape was place thereabove, and a CPU was placed thereabove. Then, the same level of power of 16.5 watts was inputted, and the temperature change was observed for 2 hours.

In Comparative Example 4, the heat-dissipating paint composition of the present invention was not coated and the same power of 16.5 watts was applied, and then the temperature change was observed for 2 hours or longer.

The results were tabulated in Table 3 below.

TABLE 3

| | Example 4 (° C.) | Example 7 (° C.) | Comparative Example 4 (° C.) |
|---|---|---|---|
| 20 min | 48.6 | 50.2 | 53.9 |
| 60 min | 78.2 | 81.7 | 84.5 |
| 120 min | 81.5 | 92.2 | 101.4 |
| 2 hours or longer | 83.7 | 95.6 | 103.5 |

It was confirmed from Table 3 above that in the case where the heat-dissipating paint composition of the present invention was coated, the temperature decrease effect of about 15% occurred.

Experimental Example 3

Heat Dissipation Test: Application to Heating Element

The heat-dissipating paint composition prepared in each of Example 4 and Example 7 was coated on the entire portion of a heating device, and then the heat dissipation performance was confirmed.

An aluminum heater was used as a heating element, and the heat-dissipating paint composition prepared in each of Example 4 and Example 7 was coated on the entire surface of the heater to a thickness of 10 μm by dip coating. The same power of 31.5 watts was applied thereto, and then the temperature change was observed. Here, the temperature was measured by installing temperature sensors at an inside and an outside of the heater.

In Comparative Example 5, the heat-dissipating paint composition of the present invention was not coated and the same power of 31.5 watts was applied, and then the temperature change was observed.

The results were tabulated in Table 4 below.

TABLE 4

| | Example 7 (° C.) | Example 10 (° C.) | Comparative Example 5 (° C.) |
|---|---|---|---|
| Inside | 139.3 | 171.3 | 184.6 |
| Outside | 133.1 | 168.1 | 172.2 |

It was confirmed from Table 4 above that in the case where the heat-dissipating paint composition of the present invention was coated, the temperature decrease effect of about 25% occurred.

Experimental Example 4

Heat Dissipation Test: Application to Condenser

The heat-dissipating paint composition prepared in each of Example 4 and Example 7 was coated on the outside of a refrigerator condenser, and then the heat dissipation performance was confirmed. As test conditions, the measurement was performed without installing a fan.

The heat-dissipating paint composition prepared in each of Example 4 and Example 7 was coated on the condenser by dip coating or spray coating, and then the condenser was allowed to operate and the entrance temperature and the exit temperature were measured, respectively.

In Comparative Example 6, the heat-dissipating paint composition of the present invention was not coated and the temperature change was observed.

The results were tabulated in Table 5 below.

TABLE 5

|  |  | Example 7 (° C.) | Example 10 (° C.) | Comparative Example 6 (° C.) |
|---|---|---|---|---|
| Dip Coating | Entrance Temperature | 60 | 60 | 60 |
|  | Exit Temperature | 56.1 | 58.1 | 59.7 |
| Spray Coating | Entrance Temperature | 60 | 60 | 60 |
|  | Exit Temperature | 55.2 | 57.6 | 59.7 |
| Spray Coating | Entrance Temperature | 60 | 60 | 60 |
|  | Exit Temperature | 53.7 | 55.8 | 59.7 |

It was confirmed from Table 5 above that in the case where the heat-dissipating paint composition of the present invention was coated, the difference between the entrance temperature and the exit temperature was 4~6° C.

INDUSTRIAL APPLICABILITY

The heat-dissipating paint composition according to the present invention has excellent heat dissipation performance and can be applied to various industrious fields requiring temperature control.

The invention claimed is:

1. A heat-dissipating paint composition, comprising: 80~99 wt % of a dispersion solution containing a surface treated carbon material, and 1~20 wt % of a heat resistant additive;
   wherein the dispersion solution containing a surface treated carbon material includes a surface treated carbon material, a styrene and acryl based water soluble resin, any one or a mixture selected from the group consisting of an ammonia water, an amine based compound, an inorganic alkali solution and a solvent;
   wherein the styrene and acryl based water soluble resin is obtained by a reaction of styrene, alphamethyl styrene, and acrylic acid;
   wherein the heat resistant additive contains an alkali soluble resin emulsion and any one or a mixture of two or more selected from the group consisting of aluminum oxide, magnesium oxide, beryllium oxide, zirconium oxide, calcium oxide, titanium oxide, zinc oxide, silicon oxide, iron oxide, boron nitride, aluminum nitride, silicon nitride, titanium nitride, zirconium nitride, hafnium nitride, and nitride of niobium; and
   wherein the alkali soluble resin is obtained by a reaction of a styrene and acryl based water soluble resin, styrene, 2-ethylhexyl acrylate and glycidyl methacrylate.

2. The heat-dissipating paint composition of claim 1, further comprising 50~150 parts by weight of an insulation additive based on 100 parts by weight of the heat-dissipating paint composition, the insulation additive being any one or a mixture of two or more selected from the group consisting of organometal sol, polyester-polyurethane copolymer, polyurethane-epoxy copolymer, polyester-polyurethane-silicone copolymer, and polyester-epoxy copolymer.

3. The heat-dissipating paint composition of claim 2, wherein the heat-dissipating paint composition is applied to products selected from the group consisting of LED lamps, electronic chips, heat exchangers, semiconductor equipment, condensers, evaporators, heaters, display devices, monitors, boiler piping, communications, engine, motors, batteries, housing materials, electrode materials, and textiles.

4. The heat-dissipating paint composition of claim 1, wherein the dispersion solution containing a surface treated carbon material includes 0.1~10 wt % of a surface treated carbon material, 0.04~50 wt % of the styrene and acryl based water soluble resin, 0.005~15 wt % of the ammonia water, amine based compound, inorganic alkali solution, or mixture thereof; and 25~99.855 wt % of the solvent.

5. The heat-dissipating paint composition of claim 1, wherein the heat resistant additive includes 0.1~20 wt % of the any one or a mixture of two or more selected from the group consisting of aluminum oxide, magnesium oxide, beryllium oxide, zirconium oxide, calcium oxide, titanium oxide, zinc oxide, silicon oxide, iron oxide, boron nitride, aluminum nitride, silicon nitride, titanium nitride, zirconium nitride, hafnium nitride, and nitride of niobium; and 80~99.9 wt % of the alkali soluble resin emulsion.

6. The heat-dissipating paint composition of claim 5, wherein the alkali soluble resin emulsion includes: water; ammonia water, amine based compound, inorganic alkali solution, or mixture thereof; and the alkali soluble resin, and has a solid content of 40~50 wt %.

7. The heat-dissipating paint composition of claim 6, wherein the alkali soluble resin is obtained by a reaction of 5~25 wt % of a styrene and acryl based water soluble resin, 0.1~5 wt % of styrene, 65~80 wt % of 2-ethylhexyl acrylate, 0.1~3 wt % of glycidyl methacrylate, and 0.1~2 wt % of an initiator; and
   wherein the styrene and acryl based water soluble resin is obtained by a reaction of 30~40 wt % of styrene, 30~35 wt % of alphamethyl styrene, and 30~35 wt % of acrylic acid in the presence of a mixed solvent of dipropylene glycol methyl ether and water.

8. The heat-dissipating paint composition of claim 1, wherein the surface treated carbon material is any one or a mixture of two or more selected from the group consisting of single-walled carbon nanotube, double walled carbon nanotube, thin multi-walled carbon nanotube, multi-walled carbon nanotube, roped carbon nanotube, graphite, graphite oxide, graphene, graphene oxide, carbon black, carbon fiber, and carbon nanofiber.

9. The heat-dissipating paint composition of claim 1, wherein the surface treated carbon material has a hydrophilic functional group selected from the group consisting of oxygen, nitrogen, sulfur, and a mixture thereof.

10. The heat-dissipating paint composition of claim 1, wherein the styrene and acryl based water soluble resin is obtained by a reaction of 30~40 wt % of styrene, 30~35 wt % of alphamethyl styrene, and 30~35 wt % of acrylic acid in the presence of a mixed solvent of dipropylene glycol methyl ether and water, the styrene and acryl based water soluble resin having a weight average molecular weight of 1,000~100,000.

11. The heat-dissipating paint composition of claim 1, wherein the heat-dissipating paint composition is applied to products selected from the group consisting of LED lamps, electronic chips, heat exchangers, semiconductor equipment, condensers, evaporators, heaters, display devices, monitors, boiler piping, communications, engine, motors, batteries, housing materials, electrode materials, and textiles.

12. A heat-dissipating paint composition, comprising: 80~95 wt % of a dispersion solution containing a surface treated carbon material, 1~15 wt % of a heat resistant additive, and 1~10 wt % of an adhesion improving emulsion;
wherein the dispersion solution containing a surface treated carbon material includes a surface treated carbon material, a styrene and acryl based water soluble resin, any one or a mixture selected from the group consisting of an ammonia water, an amine based compound, an inorganic alkali solution and a solvent;
wherein the styrene and acryl based water soluble resin is obtained by a reaction of styrene, alphamethyl styrene, and acrylic acid;
wherein the heat resistant additive contains an alkali soluble resin emulsion and any one or a mixture of two or more selected from the group consisting of aluminum oxide, magnesium oxide, beryllium oxide, zirconium oxide, calcium oxide, titanium oxide, zinc oxide, silicon oxide, iron oxide, boron nitride, aluminum nitride, silicon nitride, titanium nitride, zirconium nitride, hafnium nitride, and nitride of niobium; and
wherein the alkali soluble resin is obtained by a reaction of a styrene and acryl based water soluble resin, styrene, 2-ethylhexyl acrylate and glycidyl methacrylate.

13. The heat-dissipating paint composition of claim 12, further comprising 50~150 parts by weight of an insulation additive based on 100 parts by weight of the heat-dissipating paint composition, the insulation additive being any one or a mixture of two or more selected from the group consisting of organometal sol, polyester-polyurethane copolymer, polyurethane-epoxy copolymer, polyester-polyurethane-silicone copolymer, and polyester-epoxy copolymer.

14. The heat-dissipating paint composition of claim 13, wherein the heat-dissipating paint composition is applied to products selected from the group consisting of LED lamps, electronic chips, heat exchangers, semiconductor equipment, condensers, evaporators, heaters, display devices, monitors, boiler piping, communications, engine, motors, batteries, housing materials, electrode materials, and textiles.

15. The heat-dissipating paint composition of claim 12, wherein the adhesion improving emulsion is an acryl based resin emulsion which includes water; ammonia water, an amine based compound, an inorganic alkali solution, or a mixture thereof; and an acryl based resin and which has a solid content of 40~50 wt % and an average particle size of 30~300 nm.

16. The heat-dissipating paint composition of claim 15, wherein the acryl based resin is prepared from alkyl(meth) acryl based monomer, itaconic acid, a silane coupling agent or an acryl based cross-linking monomer, an initiator, and an additive.

17. The heat-dissipating paint composition of claim 12, wherein the dispersion solution containing a surface treated carbon material includes 0.1~10 wt % of a surface treated carbon material, 0.04~50 wt % of the styrene and acryl based water soluble resin, 0.005~15 wt % of the ammonia water, based compound, inorganic alkali solution, or mixture thereof; and 25~99.855 wt % of the solvent.

18. The heat-dissipating paint composition of claim 12, wherein the heat resistant additive includes 0.1~20 wt % of the any one or a mixture of two or more selected from the group consisting of aluminum oxide, magnesium oxide, beryllium oxide, zirconium oxide, calcium oxide, titanium oxide, zinc oxide, silicon oxide, iron oxide, boron nitride, aluminum nitride, silicon nitride, titanium nitride, zirconium nitride, hafnium nitride, and nitride of niobium; and 80~99.9 wt % of the alkali soluble resin emulsion.

19. The heat-dissipating paint composition of claim 18, wherein the alkali soluble resin emulsion includes: water; ammonia water, an amine based compound, an inorganic alkali solution, or a mixture thereof; and a alkali soluble resin, and has a solid content of 40~50 wt %.

20. The heat-dissipating paint composition of claim 19, wherein the alkali soluble resin is obtained by a reaction of 5~25 wt % of a styrene and acryl based water soluble resin, 0.1~5 wt % of styrene, 65~80 wt % of 2-ethylhexyl acrylate, 0.1~3 wt % of glycidyl methacrylate, and 0.1~2 wt % of an initiator; and
wherein the styrene and acryl based water soluble resin is obtained by a reaction of 30~40 wt % of styrene, 30~35 wt % of alphamethyl styrene, and 30~35 wt % of acrylic acid in the presence of a mixed solvent of dipropylene glycol methyl ether and water.

21. The heat-dissipating paint composition of claim 12, wherein the surface treated carbon material is any one or a mixture of two or more selected from the group consisting of single-walled carbon nanotube, double walled carbon nanotube, thin multi-walled carbon nanotube, multi-walled carbon nanotube, roped carbon nanotube, graphite, graphite oxide, graphene, graphene oxide, carbon black, carbon fiber, and carbon nanofiber.

22. The heat-dissipating paint composition of claim 12, wherein the surface treated carbon material has a hydrophilic functional group selected from the group consisting of oxygen, nitrogen, sulfur, and a mixture thereof.

23. The heat-dissipating paint composition of claim 12, wherein the heat-dissipating paint composition is applied to products selected from the group consisting of LED lamps, electronic chips, heat exchangers, semiconductor equipment, condensers, evaporators, heaters, display devices, monitors, boiler piping, communications, engine, motors, batteries, housing materials, electrode materials, and textiles.

24. The heat-dissipating paint composition of claim 12, wherein the styrene and acryl based water soluble resin is obtained by a reaction of 30~40 wt % of styrene, 30~35 wt % of alphamethyl styrene, and 30~35 wt % of acrylic acid in the presence of a mixed solvent of dipropylene glycol methyl ether and water, the styrene and acryl based water soluble resin having a weight average molecular weight of 1,000~100,000.

* * * * *

UNITED STATES PATENT AND TRADEMARK OFFICE
CERTIFICATE OF CORRECTION

PATENT NO.       : 9,624,379 B2
APPLICATION NO.  : 13/814057
DATED            : April 18, 2017
INVENTOR(S)      : Seung Hoe Do et al.

Page 1 of 1

It is certified that error appears in the above-identified patent and that said Letters Patent is hereby corrected as shown below:

In the Claims

Column 20, Line 4, Claim 17, after "water" insert -- amine --

Signed and Sealed this
Thirtieth Day of May, 2017

Michelle K. Lee
*Director of the United States Patent and Trademark Office*